(12) United States Patent
Kamijima et al.

(10) Patent No.: US 7,862,737 B2
(45) Date of Patent: Jan. 4, 2011

(54) PLANARIZING METHOD

(75) Inventors: Akifumi Kamijima, Tokyo (JP); Hideyuki Yatsu, Tokyo (JP); Hitoshi Hatate, Tokyo (JP)

(73) Assignee: TDK Corporation, Tokyo (JP)

( * ) Notice: Subject to any disclaimer, the term of this patent is extended or adjusted under 35 U.S.C. 154(b) by 425 days.

(21) Appl. No.: 11/837,189

(22) Filed: Aug. 10, 2007

(65) Prior Publication Data

US 2009/0039056 A1    Feb. 12, 2009

(51) Int. Cl.
C03C 15/00    (2006.01)
C03C 25/68    (2006.01)

(52) U.S. Cl. ............................... 216/88; 216/83; 216/95
(58) Field of Classification Search .................. None
See application file for complete search history.

(56) References Cited

U.S. PATENT DOCUMENTS

| | | | | |
|---|---|---|---|---|
| 4,676,868 A | * | 6/1987 | Riley et al. | 438/697 |
| 5,372,673 A | * | 12/1994 | Stager et al. | 438/8 |
| 5,450,205 A | * | 9/1995 | Sawin et al. | 356/632 |
| 6,440,644 B1 | * | 8/2002 | Sato et al. | 430/322 |

FOREIGN PATENT DOCUMENTS

JP    A 3-261126    11/1991

OTHER PUBLICATIONS

Marc J. Maddou, Fundamentals of Micromachining, 2002, CRC Press, 2nd Edition, 23-25, 31-32, 43-44.*

* cited by examiner

Primary Examiner—Nadine G Norton
Assistant Examiner—Stephanie Duclair
(74) Attorney, Agent, or Firm—Oliff & Berridge, PLC

(57) ABSTRACT

Provided is a planarizing method in which a planarization with high flatness can be performed, without being restricted by the distribution of film thickness in the applied resist film. The planarizing method comprises the steps of: forming a resist film on a film to be planarized formed on a substrate; exposing the resist film with the amounts of exposure light in respective sections into which an area in which the film to be planarized is formed is divided, the amounts of exposure light being determined so as to realize film thicknesses to be left for planarization of the resist film in the respective sections; developing the exposed resist film, to form a resist film pattern with a controlled distribution of film thickness; and etching the resist film pattern and the film to be planarized, until eliminating the thickness amounts to be eliminated of the film to be planarized.

7 Claims, 4 Drawing Sheets

PLANARIZING METHOD

BACKGROUND OF THE INVENTION

1. Field of the Invention

The present invention relates to a planarizing method of an object surface or a deposited film, especially relates to a planarizing method of a surface of a substrate or the like, or a film deposited on a substrate, which is used during manufacturing a magnetic device, a semiconductor device or the like.

2. Description of the Related Art

In recent years, more integrations of a magnetic device, a semiconductor device and so on have proceeded. For example, more integration of a thin-film magnetic head for reading/writing data has actively proceeded as well as higher performance, on demand for more improvement in areal recording density in the magnetic recording technique.

Most of the conventional manufacturing methods of such devices have a forming process of a predetermined element, by depositing a thin-film on a substrate and then by patterning the deposited film. Such a thin-film process meets the integration of the device by, for example, providing a microscopic width of the formed thin-film pattern with high accuracy. Here, a planarizing process is significantly important as well as the patterning process.

The planarizing process is a process for eliminating or reducing the variation in thickness or the step on the surface of the film deposited on the substrate. As a conventional technique of the planarizing process, there is, for example, an etch-back method. The etch-back method is a widely-used technique in which a resist, a spin-glass (SOG) or the like is applied so as to wholly cover the thin-film pattern formed on the substrate, and then the surface of the applied resist, SOG or the like is planarized by using an etching or a chemical mechanical polishing (CMP).

Further, as a means for resolving the negative effect of the steps, Japanese Patent Publication No. 03-261126A describes a forming method of gate electrodes of GaAs field-effect transistors (GaAs FET) in which a resist film pattern is formed with high accuracy to avoid the increase in gate length or the breaking of the formed gate electrode. Generally, a resist film pattern formed over a step portion has a tendency to become thicker around the step. As a result, it becomes difficult to perform an appropriate exposure to the whole resist film pattern. As a measure against this problem, the above-described forming method has a process to expose the resist film on the step portion separately in order to appropriately expose the whole resist film pattern.

However, even in this conventional technique, there has been a problem that a distribution or variation of film thickness in the resist film occurs when applying the resist, and thus, the distribution or variation of film thickness in the planarized film remains even after performing the planarizing process.

For example, in the case of planarizing a step by using the above-described etch-back method, under the presence of the distribution or variation of film thickness in the resist film as a buffer layer, it is significantly difficult to reduce the step within the amount of the distribution or variation. Further, in the case of planarizing a deposited film on a predetermined area of the substrate, the distribution of film thickness in the applied resist film occurs in this area when applying the resist. Therefore, it is also significantly difficult to suppress the distribution of film thickness in the planarized film within the amount of the distribution of film thickness in the applied resist film.

BRIEF SUMMARY OF THE INVENTION

Therefore, an object of the present invention is to provide a planarizing method in which a planarization with high flatness can be performed, without being restricted by the distribution or variation of film thickness in the applied resist film.

According to the present invention, a planarizing method is provided, which comprises the steps of:

forming a resist film on a film to be planarized formed on a substrate;

exposing the resist film with the amounts of exposure light in respective sections into which an area is divided, the area being a region in which the film to be planarized is formed, the amounts of exposure light being determined so as to realize film thicknesses to be left for planarization of the resist film in the respective sections;

developing the exposed resist film, to form a resist film pattern with a controlled distribution of film thickness; and etching the resist film pattern and the film to be planarized, until eliminating the thickness amounts to be eliminated of the film to be planarized.

In the just-described planarizing method according to the present invention, the resist film pattern with the adjusted distribution of film thickness can be provided, corresponding to the variation or step of film thickness in the target film to be planarized. Therefore, a planarization with high flatness by such an etching as an ion milling can be realized with use of the resist film pattern with the controlled distribution of film thickness.

In the planarizing method according to the present invention, the film thicknesses to be left of the resist film are preferably determined from the thickness amounts to be eliminated of the film to be planarized in the respective sections. In this occasion, it is further preferable that: an intended film thickness after planarization of the film to be planarized is set; a total etching time required to obtain the intended film thickness after planarization is determined in a section including a portion with the smallest film thickness in the film to be planarized; times required to etch the resist film in the section including the portion with the smallest film thickness and the other sections are determined from the total etching time; and then, the film thicknesses to be left of the resist film are obtained.

Further, in the planarizing method according to the present invention, it is also preferable that: an area on which the resist film is formed is divided into sections each of which has a size equivalent to that of a window of a stepper; and then, the exposure in each of the sections is performed by using the stepper. The stepper originally has a function of exposing each section of a series of these sections, and further has a function of changing the amount of exposure light in each section.

Furthermore, in the planarizing method according to the present invention, it is also preferable that the exposure in each of the sections is performed by using a gray-tone mask or a half-tone mask which realizes the required amounts of exposure light in the respective sections at one time. By using the appropriately-designed gray-tone mask or half-tone mask, the exposure can be performed at one time. Further the size of each section can be set to be smaller.

Further objects and advantages of the present invention will be apparent from the following description of preferred embodiments of the invention as illustrated in the accompanying figures. In each figure, the same element as an element shown in other figure is indicated by the same reference numeral. Further, the ratio of dimensions within an element and between elements becomes arbitrary for viewability.

DETAILED DESCRIPTION OF THE INVENTION

FIGS. 1a to 1f show cross-sectional views explaining one embodiment of the planarizing method according to the present invention. Each of the cross-sectional views has a cross-section taken by a plane perpendicular to an element formation surface, on which elements are to be formed, of the substrate. FIG. 1g shows a flowchart illustrating one embodiment of the planarizing method according to the present invention.

Figure 1A:
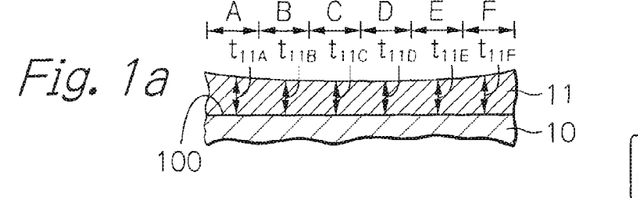
FIGS. 1a to 1f show cross-sectional views explaining one embodiment of the planarizing method according to the present invention.

As shown in FIG. 1a, a target film 11 to be planarized is deposited on an element formation surface 100 (or a flat upper surface of a layer) of a substrate 10 (or the layer formed on the substrate). The target film 11 has a film thickness of approximately 10 nm (nanometers) to 10 µm (micrometers), and are formed by using, for example, a sputtering method, a plating method, an evaporating method, a chemical vapor deposition (CVD) method, an applying method, a sol-gel method or the like. Although only a portion of the target film 11 is shown in the figure, the target film 11 may be formed on a predetermined area of the substrate, or may be formed on the whole element formation surface of the substrate.

The target film 11 has a predetermined distribution of film thickness. The film thicknesses of the target film 11 at the central portions of sections A to F are $t_{11A}$, $t_{11B}$, $t_{11C}$, $t_{11D}$, $t_{11E}$ and $t_{11F}$, respectively. In FIG. 1a, the film thicknesses $t_{11C}$ and $t_{11D}$ in sections C to D, which are central sections in the deposited area, are the smallest of these film thicknesses. That is, the target film 11 has a concave upper surface.

Figure 1B:
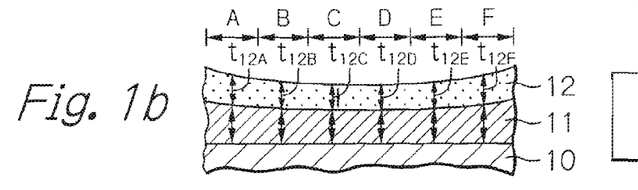

As shown in FIG. 1b, a resist film 12 is formed on the formed target film 11 (step S1 (FIG. 1g)). The resist film 12 can be formed of an applied positive type photoresist usually-used. The film thicknesses of the resist film 12 at the central portions of sections A to F are $t_{12A}$, $t_{12B}$, $t_{12C}$, $t_{12D}$, $t_{12E}$ and $t_{12F}$, respectively. In FIG. 1b, the film thicknesses $t_{12C}$ and $t_{12D}$ in sections C to D, which are central sections in the applied area, are the smallest of these film thicknesses. This distribution of resist-film thickness may occur, when the substrate is attached to a spinner and is rotated, and then, the resist is dropped to be applied on the rotated substrate. That is, the film thickness of the resist film becomes the smallest near the center of rotation, and thus, the distribution may occur, in which, at the more outer position, the larger becomes the film thickness concentrically.

In the case shown in FIG. 1b in which the applied resist film has the above-described distribution of film thickness, the target film 11 cannot be planarized if being etched conventionally from above the substrate, because the distribution of resist-film thickness is almost directly reflected on the target film 11. In some cases, the breadth of the distribution of film thickness in the target film 11 may become larger.

Figure 1C:
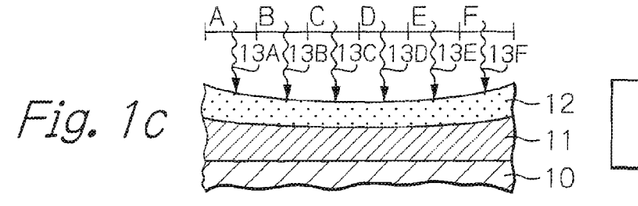

On the contrary, as shown in FIG. 1c, each portion of the resist film 12 in sections A to F is exposed with the controlled amount of light (step S2 (FIG. 1g)).

Figure 2:
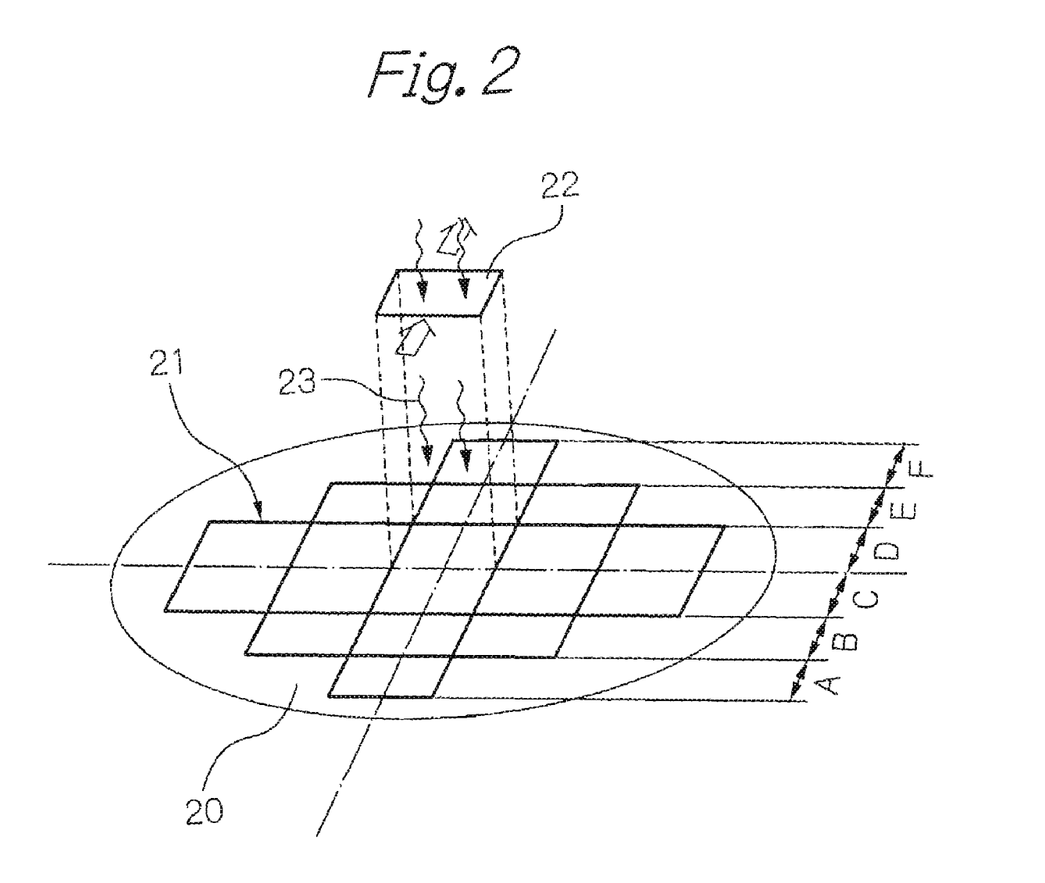
FIG. 2 shows a perspective view schematically illustrating a method for exposing each section of the resist film.

FIG. 2 shows a perspective view schematically illustrating a method for exposing each section of the resist film 12.

As shown in FIG. 2, the exposure shown in FIG. 1c can be performed by using, for example, a stepper. In the figure, sections A to F are a part of sections into which an area 21 is divided, the area 21 being a region on the substrate 20 in which the target film 11 is formed and the resist film 12 is applied. Sections A to F are aligned on the diameter of the substrate. To each of the sections, an exposure light 23 with the controlled amount is irradiated through a window 22 of the stepper. On this occasion, the stepper has no reticles and masks to realize the uniform amount of exposure light irradiated from the window. The amount of exposure light (the dose amount) can be set in 16 levels or more, for example.

The shape of the window 22 is not limited to be rectangular, however, is preferably a shape with which the exposed region in every step of moving the substrate 20 can be aligned without space. The window 22 may have an area of, for example, 1 mm (millimeter) square to 25 mm square. The area of each section becomes equivalent to the area of the window 22. Further, a planarized film with higher flatness can be obtained by reducing the area of each section and increasing the number of the sections.

Next, returning to FIG. 1c, the amount of exposure light will be explained. The amounts of exposure lights 13A to 13F in respective sections A to F can be designed so as to realize the film thicknesses of the resist film 12 to be left after exposure for planarization, which are determined in respective sections.

The film thicknesses of the resist film 12 to be left after exposure can be determined from the thickness amounts to be eliminated by etching of the target film 11 in respective sections A to F. For example, in advance, (the distribution of) the film thicknesses of the target film 11 in respective sections A to F are determined, for example, from the observation of the cross-section of the target film 11 performed by a process and observation system of focused ion beam (FIB) or a scanning electron microscope (SEM), or from the measurement of the surface profile of the target film 11 performed by a surface profiler with sensing pin. Next, the intended film thickness $t_S$ of the target film 11 after planarization is set, and the total etching time needed for obtaining the intended film thickness $t_S$ is determined in a section including a portion with the smallest film thickness (section D in the present embodiment). For this determination, needed is the data of etching rates of the target film 11 and the resist film 12. Next, etching times to be needed for etching the resist film 12 in respective section D and the other sections A to C, E and F are determined from the determined total etching times, which gives the thickness amounts to be left of the target film 11 in respective sections A to F.

Then, the method for determining the amounts of exposure light needed for realizing the obtained thickness amounts to be left in respective sections.

Figure 3:
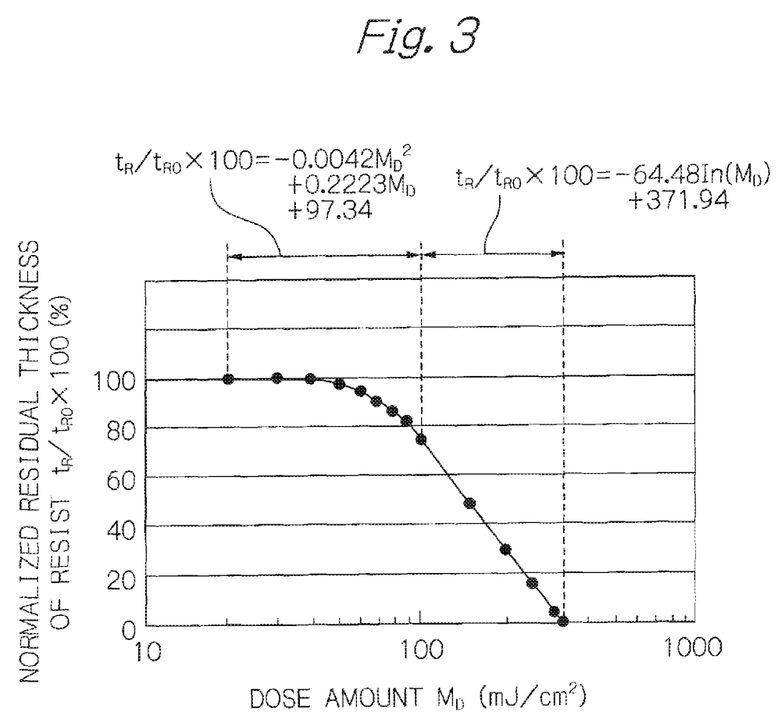
FIG. 3 shows a graph illustrating an example of the relation between the irradiated amount of exposure light and the film thickness of the resist film after exposure and development.

FIG. 3 shows a graph illustrating an example of the relation between the irradiated amount of exposure light and the film thickness of the resist film 12 after exposure and development. In the graph, the horizontal axis $M_D$ indicates the irradiated amount of exposure light (the dose amount). And the vertical axis $t_R/t_{R0}\times100$ indicates the rate (percentage) of: the residual film thickness $t_R$ of the resist film 12 after exposure and development; and the film thickness $t_{R0}$ of the resist film 12 before exposure. That is, the rate corresponds to the normalized residual thickness of the resist film 12 after exposure and development presented by percent terms.

According to FIG. 3, in the range in dose amount $M_D$ of 20 to 100 mJ/cm² (millijoules per square centimeter), the residual film thickness $t_R$ and the dose amount $M_D$ satisfy an approximate relational expression as follows:

$$t_R/t_{R0}\times100=-0.0044\times M_D^2+0.2223\times M_D+97.34 \quad (1)$$

Further, in the range in dose amount $M_D$ of 100 to 300 mJ/cm², there is an approximate relational expression as follows:

$$t_R/t_{R0}\times100=-64.48\times\ln(M_D)+371.94 \quad (2)$$

By using the relational expression (1) or (2), the amounts of exposure light needed for realizing the thickness amounts to be left in respective sections A to F can be determined from the thickness amounts to be left. It should be noticed that, in the present invention, used is the dose amount that provides the intermediate value of $t_R/t_{R0}\times100$, not used is the dose amount that provides $t_R/t_{R0}\times100$ value of 100% nor 0%.

Figure 1D:
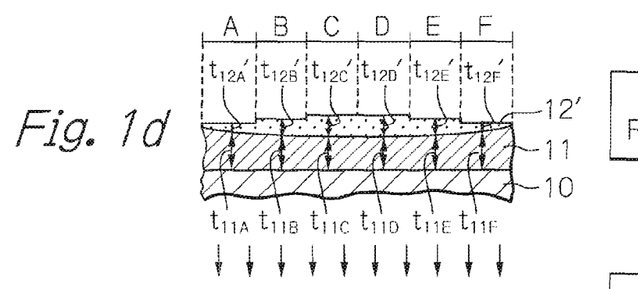

As described above, the exposure process (step S2 (FIG. 1g)) shown in FIG. 1c is performed, and then, the exposed resist film 12 is developed. As a result, a resist film pattern 12' having controlled residual film thicknesses is formed as shown in FIG. 1d (step S3 (FIG. 1g)). The resist film pattern 12' has the residual film thicknesses $t_{12A}'$, $t_{12B}'$, $t_{12C}'$, $t_{12D}'$, $t_{12E}'$ and $t_{12F}'$ in respective sections A to F. Further, in FIG. 1d, the residual film thicknesses $t_{12C}'$ and $t_{12D}'$ in the central sections C and D are the most largest in all the resist-applied sections. Here, when the etching rate of the target film 11 to be planarized is defined as $R_P$, the etching rate of the resist film pattern 12' is defined as $R_R$, and the intended film thickness after planarization of the target film 11 is defined as $t_S$, the $t_{11A}$ to $t_{11F}$ and $t_{11A}'$ to $t_{12F}'$ are designed so that the etching time TE, in the case that the resist film pattern is wholly removed by the etching, satisfies the relational expression as follows:

$$\begin{aligned}TE &= (t_{11A}-t_S)/R_P + t_{12A}'/R_R \\ &= (t_{11B}-t_S)/R_P + t_{12B}'/R_R \\ &\cdots \\ &= (t_{11F}-t_S)/R_P + t_{12F}'/R_R\end{aligned} \quad (3)$$

Figure 1E:
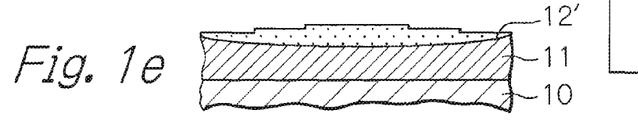
Figure 1F:
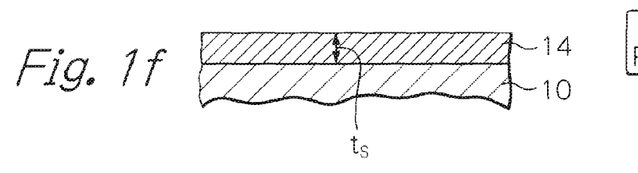
Figure 1G:
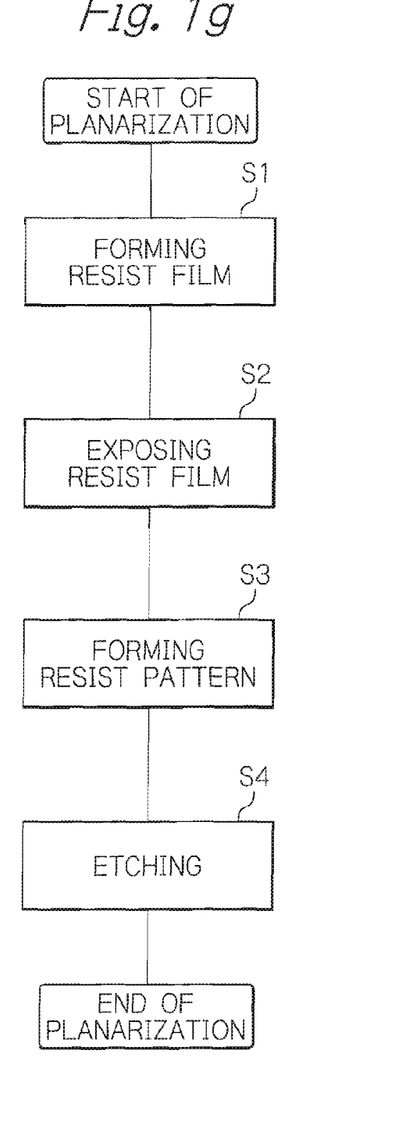
FIG. 1g shows a flowchart illustrating one embodiment of the planarizing method according to the present invention.

Next, as shown in FIG. 1e, the etching process is performed (step S4 (FIG. 1g)), which can be performed by using, for example, a dry etching method such as an ion milling method, a reactive ion etching (RIE) method or the like. Here, the film thicknesses $t_{11A}$ to $t_{11F}$ of the target film 11 and the film thicknesses $t_{12A}'$ to $t_{12F}'$ of the resist film pattern 12' satisfy the relational expression (3). Therefore, a planarized film 14 with uniform film thickness $t_S$, which is obtained by planarizing the target film 11, is realized by performing the etching process with the etching time TE (FIG. 1f).

Whereas, the planarizing method according to the present invention is not limited to the above-described embodiment. Then, other embodiments will be explained below.

Figure 4A:
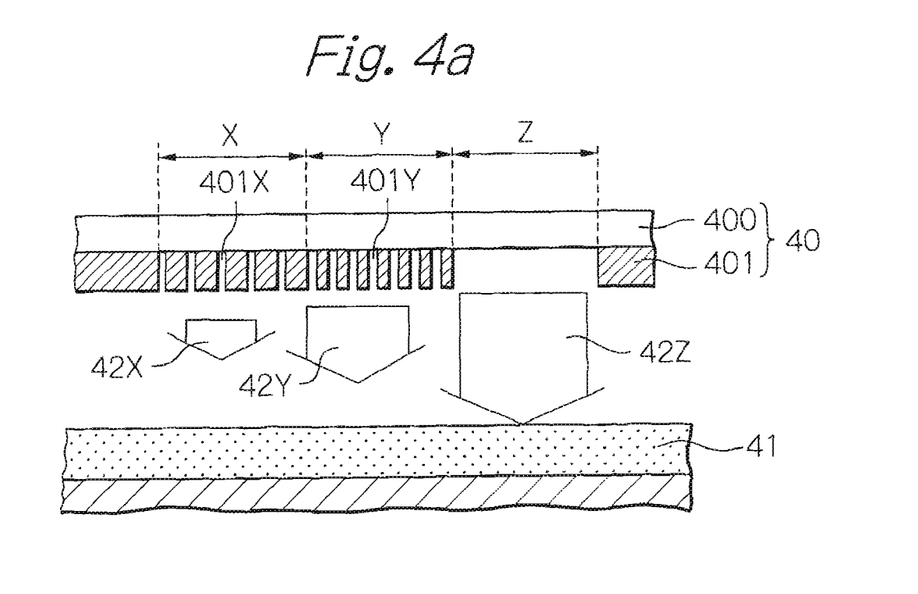
FIGS. 4a and 4b show schematic views illustrating other embodiments of the planarizing method according to the present invention.
Figure 4B:
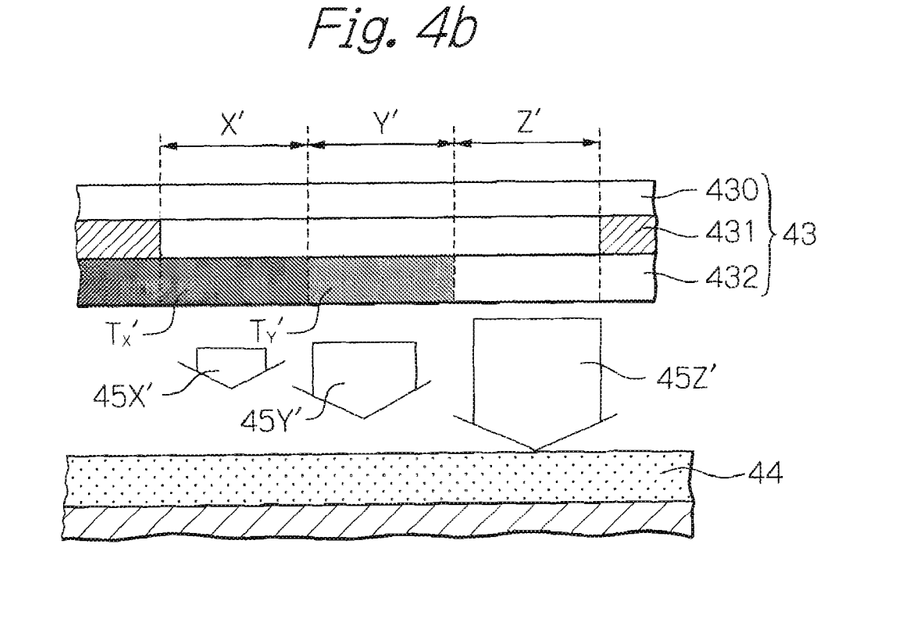

FIGS. 4a and 4b show schematic views illustrating other embodiments of the planarizing method according to the present invention. Each figure shows cross-sections of a substrate and of a used mask, taken by a plane perpendicular to the element formation surface of the substrate.

The embodiment shown in FIG. 4a uses a photolithography machine with a gray-tone mask 40 attached, instead of a stepper, in the exposure process (step S2 (FIG. 1g)) after applying the resist film 41. The gray-tone mask 40 has a layered structure in which a light-shielding film 401 is formed on a mask substrate 400 made of a glass or the like, and the predetermined area of the light-shielding film 401 has slits (401X and 401Y in FIG. 4a). Each of the slits has a slit width less than or equal to the resolution of the photolithography machine. Therefore, a part of exposure light passes through the slits, which realizes an intermediate exposure with the controlled amount of exposure light.

In FIG. 4a, the light-shielding film 401 does not exist in section Z, and has slits 401X and 401Y in respective sections X and Y. The slits 401X and 401Y are designed so that the slits 401X have higher passage rate than the slits 401Y. As a result, in sections X, Y and Z, the amount of exposure light 42Z in section Z is the largest, the amount of exposure light 42Y in section Y is the second largest, and the amount of exposure light 42X in section X is the last. As just described, the gray-tone mask 40 enables the exposure with the controlled amount of light to be performed to every section of the resist film 41 at one time.

The embodiment shown in FIG. 4b uses a half-tone mask 43 instead of the gray-tone mask 40, in the embodiment shown in FIG. 4a. The half-tone mask 43 has a layered structure in which a light-shielding film 431 and a half-transparent film 432 are sequentially formed on a mask substrate 430 made of a glass or the like. The half-transparent film 432 has predetermined and controlled transmission factors to the exposure light. Therefore, a part of exposure light passes through the half-transparent film 432, which realizes an intermediate exposure with the controlled amount of exposure light.

In FIG. 4b, the light-shielding film 431 does not exist in sections X', Y' and Z', whereas the half-transparent film 432 exists in sections X' and Y', and the transmission factors of the half-transparent film 432 in sections X' and Y' are set to be $T_X'$ and $T_Y'$ ($0<T_X'<T_Y'<1$), respectively. As a result, in sections X', Y' and Z', the amount of exposure light 45Z' in section Z' is the largest, the amount of exposure light 45Y' in section Y' is the second largest, and the amount of exposure light 45X' in section X' is the last. As just described, the half-tone mask 43 also enables the exposure with the controlled amount of light to be performed to every section of the resist film 44 at one time.

As described above, in the embodiments shown in FIGS. 4a and 4b, the exposure can be performed at one time by using the appropriately-designed gray-tone mask 40 or half-tone mask 43, in contrast to the above-described embodiment using the stepper. Further, in these embodiments, the area of each section can be set to be smaller, compared to that in the above-described embodiment using the stepper. Therefore, a planarized film with higher flatness can be provided. Especially, in the case of using the half-tone mask 43, an ultimate film thickness control of the planarized film, corresponding to the infinitely small size of each section and the infinitely large number of the sections, can be performed by using a half-tone mask 43 with continuously distributed transmission factor. As a result, a planarized film with much higher flatness can be provided.

Hereinafter, the effect of the planarizing method according to the present invention will be explained by using a practical example and a comparative example.

PRACTICAL EXAMPLE

Table 1 shows implementation conditions and measurement results in the practical example of the planarizing method according to the present invention.

TABLE 1

| | Section | | | | | |
|---|---|---|---|---|---|---|
| | A | B | C | D | E | F |
| Ta1: Thickness of Ni Film (μm) | 5.50 | 5.00 | 4.50 | 4.50 | 5.00 | 5.50 |
| Ta2: Thickness of resist film (μm) | 3.03 | 3.00 | 2.97 | 2.97 | 3.00 | 3.03 |
| Ta3: Intended thickness of Ni Film (μm) | 4 | 4 | 4 | 4 | 4 | 4 |
| Ta4: Milling rate of Ni film (μm/min) | 0.99 | 0.99 | 1.00 | 1.00 | 1.01 | 1.01 |
| Ta5: Milling rate of resist film (μm/min) | 2.48 | 2.49 | 2.50 | 2.51 | 2.52 | 2.53 |
| Ta6: Required etching time of Ni film (sec) | 90.90 | 60.36 | 30.06 | 29.94 | 59.64 | 89.10 |
| Ta7: Etching time to be needed of resist film (sec) | 9.70 | 40.24 | 70.54 | 70.66 | 40.96 | 11.50 |
| Ta8: Required thickness of resist (μm) | 0.40 | 1.67 | 2.93 | 2.95 | 1.72 | 0.48 |
| Ta9: Dose amount (mJ/cm$^2$) | 259.40 | 133.00 | 38.94 | 0 | 129.55 | 248.64 |
| Ta10: Residual resist thickness (μm) | 0.40 | 1.67 | 2.93 | 2.95 | 1.72 | 0.48 |
| Ta11: Residual Ni thickness (μm) | 4.00 | 4.00 | 4.00 | 4.00 | 4.00 | 4.00 |

Hereinafter, the implementation conditions and the measurement results in the practical example will be explained according to Table 1. In the practical example, first, a Ni electrode film with a thickness of 0.1 μm, used as an electrode during plating, was deposited on a Si (silicon) substrate with a thickness of 2 mm and a diameter of 6 inches, by using a sputtering method. Next, a Ni plating film was deposited by using a plating method with a Ni Watts bath and with the deposited Ni electrode film as an electrode. The set film thickness of the Ni plating film was 5 μm. After that, a positive type photoresist (AZ4000 manufactured by AZ Electronic Materials) was applied on the deposited Ni plating film, by using a spinner. And then, the applied resist was pre-baked with a predetermined condition. The set film thickness of the resist film was 3 μm. Here, as shown in FIG. 2, six sections A to F aligned on the diameter of the substrate were set in the area where the Ni film (the Ni electrode film and the Ni plating film) was formed and the photoresist was applied. The size of each of sections A to F was 25 mm square.

Then, at the central point of each of sections A to F, the film thickness of the formed Ni film was determined from the observation of the cross-section of the Ni film performed by a process and observation FIB system. Ta1 of Table 1 shows the results, in which, at the more outer position from the central portion of the substrate, the larger becomes the film thickness of the Ni film concentrically, and thus, the film thickness of the Ni film is the smallest in the central sections C and D. The distribution of film thickness in the whole Ni film was approximately ±10%. In accordance with these results, the intended film thickness of the Ni Film after planarization was set to be 4 μm, as shown in Ta3 of Table 1.

Also, at the central point of each of sections A to F, the film thickness of the applied resist film was determined by using an optical interference method. Ta2 of Table 1 shows the results, in which, at the more outer position from the central portion of the substrate corresponding to the rotation center of the spinner, the larger becomes the film thickness of the resist film concentrically, and thus, the film thickness of the resist film is the smallest in the central sections C and D. The distribution of film thickness in the whole resist film was approximately ±1%.

Next, required etching times of the Ni film (Ta6) were determined from the distribution of film thickness in the Ni film (Ta1) and the intended film thickness $t_S$ after planarization of the Ni film (Ta3). In advance, the distribution of etching rate (milling rate) of the Ni film (Ta4), which was needed for the above determination, was measured in the utilized ion milling machine. Then, etching times to be needed for etching of the resist film (Ta7) were determined from the required etching times of the Ni film (Ta6). In advance, the distribution of etching rate (milling rate) of the resist film (Ta5), which was needed for the above determination, was measured in the utilized ion milling machine. As the results of the measurements, it was found that the etching rate of each of the Ni film and the resist film increased as from section A to section F, and there was a maximum difference of approximately 2% among the measured etching rates. The milling rate of the resist film was approximately 2.5 times higher than that of the Ni film.

The etching times to be needed of the resist film (Ta7) were determined as follows: first, in section D that has the smallest film thickness of the Ni film, determined is the total etching time required for causing the etched Ni film to have the intended film thickness $t_S$ of 4 μm, which is the sum of an etching time needed for etching the Ni film and an etching time needed for etching the applied resist film; and then, etching times to be needed of the resist film (Ta7) were calculated by subtracting the required etching time of the Ni film in each of sections A, B, C, E and F from the just-described total etching time.

Then, required film thicknesses of the resist film in respective sections A to F (Ta8) were determined from the determined etching times to be needed of the resist film (Ta7). Further, then, the dose amounts of exposure light in respective sections A to F (Ta9) were determined from the required film thicknesses of the resist film (Ta8), by using the graph shown in FIG. 3. Here, in section D that has the smallest film thickness of the Ni film, the dose amount were zero due to the condition of not exposing the resist film in section D.

Next, the exposure process was performed in each of sections A to F according to the determined dose amounts of exposure light (Ta9). In the exposure process, a stepper was used as shown in FIG. 2, which had a window with the size of 25 mm square and provided an exposure light of Hg: i-line (wavelength: 365 nm). After the exposure, a resist film pattern was formed through the development with TMAH aqueous solution of 2.38 wt %. Ta10 of Table 1 shows the residual film thicknesses of the resist film pattern (residual resist thicknesses). It is understood that the residual resist thicknesses after exposure and development (Ta10) is equivalent to the required film thicknesses of the resist film (Ta8) which were calculated, in respective sections A to F. In section D of Table 1, the reason why the residual resist thickness (Ta10) is slightly decreased from the film thickness of the applied resist film (Ta2), regardless of no exposure, is that the resist film decreased in film thickness due to the developing solution.

The dose amounts of exposure light (Ta9) were determined in consideration of this decrease in film thickness due to the development.

After that, the resist film and the Ni film were etched by using an ion-milling method with Ar (argon) gas, performed by an ion milling machine. The ion beam had a direction perpendicular to the substrate. The etching time was set to be the total etching time determined in section D (the sum of the etching time needed for etching the Ni film and the etching time needed for etching the applied resist film). The milling was performed until the Ni film is etched by the amount of thickness to be eliminated. Ta1 of Table 1 shows the residual film thicknesses of the Ni film after etching (residual Ni thicknesses). The Ni film after etching had a uniform film thickness with the variation in the order of 0.01 μm or less. As understood from the just described, the Ni film was planarized with excellently high flatness in the practical example.

COMPARATIVE EXAMPLE

Table 2 shows the comparative example for comparison with the planarizing method according to the present invention.

TABLE 2

|  | Section | | | | | |
|---|---|---|---|---|---|---|
|  | A | B | C | D | E | F |
| Ta12: Thickness of Ni Film (μm) | 5.50 | 5.00 | 4.50 | 4.50 | 5.00 | 5.50 |
| Ta13: Thickness of resist film (μm) | 3.03 | 3.00 | 2.97 | 2.97 | 3.00 | 3.03 |
| Ta14: Intended thickness of Ni Film (μm) | 4 | 4 | 4 | 4 | 4 | 4 |
| Ta15: Dose amount (mJ/cm$^2$) | 0 | 0 | 0 | 0 | 0 | 0 |
| Ta16: Residual Ni thickness (μm) | 5.05 | 4.53 | 4.01 | 4.01 | 4.51 | 5.02 |

Hereinafter, the implementation conditions and the measurement results in the comparative example will be explained according to Table 2. In the comparative example, the settings of the substrate, the Ni film to be planarized, the applied resist film, and sections A to F were the same as those of the practical example, and the film thickness of the Ni film (Ta12), the film thickness of the resist film (Ta13), and the intended film thickness $t_S$ of the Ni film after planarization (Ta14) were also the same as those of the practical example.

In the comparative example, there was neither such exposure nor development process as was performed in the practical example. Therefore, the dose amounts in Ta15 of Table 2 are zero.

Further, in the comparative example, after the applied resist film was pre-baked, the etching process with an ion milling method was performed as the resist film was. The utilized ion milling machine was the same as that of the practical example. Therefore, the distributions of etching rates of the Ni film and the resist film were also the same as those of the practical example (as Ta4 and Ta5 of Table 1). Here, the etching time in the comparative example was determined to be the etching time required for causing the etched Ni film to have the intended film thickness $t_S$ of 4 μm in section D having the smallest film thickness of the Ni film, with use of the etching rates of the Ni film and the resist film (Ta4 and Ta5 of Table 1).

Ta16 of Table 2 shows the residual film thicknesses of the Ni film after etching (residual Ni thicknesses). The Ni film after etching had a distribution of film thickness with the width of approximately 1 μm over sections A to F. As understood from the just described, a high flatness such as the practical example showed could not be obtained at all in the comparative example.

As explained above, it is understood that, according to the planarizing method of the present invention, a planarization with higher flatness can be performed, without being restricted by the distribution or variation of film thickness in the applied resist film.

All the foregoing embodiments are by way of example of the present invention only, and not intended to be limiting, and many widely different alternations and modifications of the present invention may be constructed without departing from the spirit and scope of the present invention. Especially, the present invention can be applied not only to the manufacture of a magnetic device, a semiconductor device or the like, but also to the maintenance or adjustment of samples provided for various applications such as examination or measurement. Accordingly, the present invention is limited only as defined in the following claims and equivalents thereto.

The invention claimed is:

1. A planarizing method comprising the steps of:
   forming a resist film on a film to be planarized, the film to be planarized being formed on a substrate;
   dividing an area in which the film to be planarized was formed into a plurality of sections of equal size, the plurality of sections including the film to be planarized;
   determining for each section an intended film thickness after planarization of the film to be planarized;
   determining a total etching time required to obtain the determined intended film thickness for each section after planarization, in a section including a portion of the film to be planarized with a smallest film thickness;
   determining for each section a time to be taken for etching the resist film from the determined total etching time and a thickness amount to be eliminated from the film to be planarized;
   determining for each section a film thickness to be left for planarization of the resist film from the determined time to be taken for etching the resist film for each section;
   exposing for each section said resist film to an amount of exposure light, the amount of exposure light being determined so as to realize the determined film thickness to be left for planarization of said resist film;
   developing the exposed resist film, to form a resist film pattern with a controlled film thickness in each section; and
   etching said resist film pattern and said film to be planarized, until eliminating the thickness amounts to be eliminated of said film to be planarized.

2. The planarizing method as claimed in claim 1, wherein an area on which said resist film is formed is divided into sections each of which has a size equivalent to that of a window of a stepper, and then, the exposure in each of said sections is performed by using said stepper.

3. The planarizing method as claimed in claim 1, wherein the exposure in each of the sections is performed by using a gray-tone mask or a half-tone mask which realizes the required amounts of exposure light in the respective sections at one time.

4. The planarizing method as claimed in claim 1, wherein an ion milling method is used for the etching step.

5. The planarizing method as claimed in claim 1, wherein the sections are of equal size and aligned in a direction along a diameter of the substrate.

6. The planarizing method as claimed in claim 1, further comprising, after forming, measuring in each section the initial thickness of the film to be planarized and the initial thickness of the resist film.

7. The planarizing method as claimed in claim 1, wherein the required etching time for each section is determined from the initial film thicknesses of the film to be planarized and the intended film thickness after planarization.

* * * * *